United States Patent
Kang et al.

(10) Patent No.: US 7,075,833 B2
(45) Date of Patent: Jul. 11, 2006

(54) CIRCUIT FOR DETECTING NEGATIVE WORD LINE VOLTAGE

(75) Inventors: Khil Ohk Kang, Seoul (KR); Kee Teok Park, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/872,346

(22) Filed: Jun. 18, 2004

(65) Prior Publication Data

US 2005/0128820 A1    Jun. 16, 2005

(30) Foreign Application Priority Data

Dec. 10, 2003   (KR) .................... 10-2003-0089322

(51) Int. Cl.
 *G11C 5/14* (2006.01)
 *G11C 7/00* (2006.01)

(52) U.S. Cl. ............................. 365/189.09; 365/189.11

(58) Field of Classification Search ................ 365/189, 365/189.11, 189.09
See application file for complete search history.

(56) References Cited

U.S. PATENT DOCUMENTS 6,496,027 B1 * 12/2002 Sher et al. .................. 324/763
6,943,402 B1 *  9/2005 Nagasaka et al. ........... 257/316

OTHER PUBLICATIONS

Korean Office Action for Korean Patent Application No. 2003-89322 dated Sep. 29, 2005.

* cited by examiner

*Primary Examiner*—Amir Zarabian
*Assistant Examiner*—Anthan Tran
(74) *Attorney, Agent, or Firm*—Marshall, Gerstein & Borun LLP

(57) ABSTRACT

The present invention discloses a circuit for detecting a negative word line voltage including a detecting unit for detecting a negative word line voltage in a detection node by using a plurality of loads coupled in series between a power supply terminal and a negative word line voltage terminal, a test signal generating unit for generating a plurality of test signals for detecting variations of the negative word line voltage, and a control unit driven according to the test signals, for controlling a potential of the detection node by adjusting a number of the loads of the detecting unit. The circuit for detecting the negative word line voltage can detect a wanted level of negative word line voltage by using the plurality of test signals without modifying the circuit, to reduce a development period of DRAM semiconductor products.

14 Claims, 5 Drawing Sheets

CIRCUIT FOR DETECTING NEGATIVE WORD LINE VOLTAGE

BACKGROUND OF THE INVENTION

1. Field of the Invention

The present invention relates to a circuit for detecting a negative word line voltage, and more particularly to a circuit for detecting a negative word line voltage which can detect levels of a plurality of negative word line voltages by using test signals without modifying the circuit.

2. Description of the Background Art

A DRAM applies about −0.3V of negative word line voltage VBBW lower than 0V to 3.0V of high voltage VPP to a word line in order to control the word line. Accordingly, the DRAM stably controls the word line by reducing a leakage current, thereby stabilizing the circuit.

FIG. 1 is a structure diagram illustrating a conventional circuit for detecting a negative word line voltage.

As illustrated in FIG. 1, a first PMOS transistor P11 driven according to a ground voltage VSS is diode-coupled between a power supply terminal VCORE and a first node Q11, and first to third NMOS transistors N11 to N13 are diode-coupled between the first node Q11 and a negative word line voltage terminal VBBW. Here, it is desirable to change −1V to +1V of negative word line voltage VBBW to obtain a wanted negative word line voltage VBBW. Therefore, a potential of the first node Q11 is changed according to the negative word line voltage VBBW, having a difference of threshold voltages of the first to third NMOS transistors N11 to N13. When the potential of the first node Q11 is greater than a threshold voltage of an NMOS transistor of an inverter I11, the NMOS transistor is turned on to output a signal having ground voltage level VSS, and the signal is inverted through a second inverter I12 as a high state signal. Here, the operator acquires the negative word line voltage VBBW.

However, referring to FIG. 2 showing simulation results of the circuit of FIG. 1, the conventional circuit detects only one voltage level. When a wanted voltage level is not obtained due to a temperature or other process factors, the circuit must be modified. In the case that the circuit is modified, the whole process and tests must be re-performed to obtain the modified circuit, which remarkably increases time and expenses. As a result, the development of the products is delayed and the forwarding time of the products is lost, to reduce competitiveness.

SUMMARY OF THE INVENTION

The present invention is achieved to solve the above problems. Accordingly, it is a primary object of the present invention to provide a circuit for detecting a negative word line voltage which can detect various levels of negative word line voltages in test modes.

Another object of the present invention is to provide a circuit for detecting a negative word line voltage which can reduce a development period of products by detecting a wanted level of negative word line voltage in test modes without modifying the circuit.

In order to achieve the above-described objects of the invention, there is provided a circuit for detecting a negative word line voltage, including: a detecting unit for detecting a negative word line voltage in a detection node by using a plurality of loads coupled in series between a power supply terminal and a negative word line voltage terminal; a test signal generating unit for generating a plurality of test signals for detecting variations of the negative word line voltage; and a control unit driven according to the test signals, for controlling a potential of the detection node by adjusting a number of the loads of the detecting unit.

The detecting unit includes: a first load coupled between the power supply terminal and the detection node, for supplying a power supply voltage; and a plurality of second loads coupled in series between the detection node and the negative word line voltage terminal.

The first load includes a diode and a resistance, and each of the second loads includes a diode and a resistance.

The test signal generating unit generates: a first test signal for detecting rise of the negative word line voltage; a second test signal for detecting fall of the negative word line voltage; and a third test signal for detecting the negative word line voltage in a normal state.

A NOR gate generates the third test signal by NORing the first test signal and the second test signal.

The control unit includes a plurality of switches driven according to the plurality of test signals from the test signal generating unit, respectively, for controlling coupling of the loads of the detecting unit.

The switches are NMOS transistors coupled in parallel to the loads of the detecting unit.

According to one aspect of the invention, a circuit for detecting a negative word line voltage includes: a first load coupled between a power supply terminal and a detection node, for supplying a power supply voltage; a plurality of second loads coupled in series between the detection node and a negative word line voltage terminal; a test signal generating unit for generating a plurality of test signals for detecting variations of a negative word line voltage; and a control unit coupled in parallel to the second loads and driven according to the test signals, for controlling a potential of the detection node by adjusting a number of the second loads.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A circuit for detecting a negative word line voltage in accordance with preferred embodiments of the present invention will now be described in detail with reference to the accompanying drawings.

Figure 1:
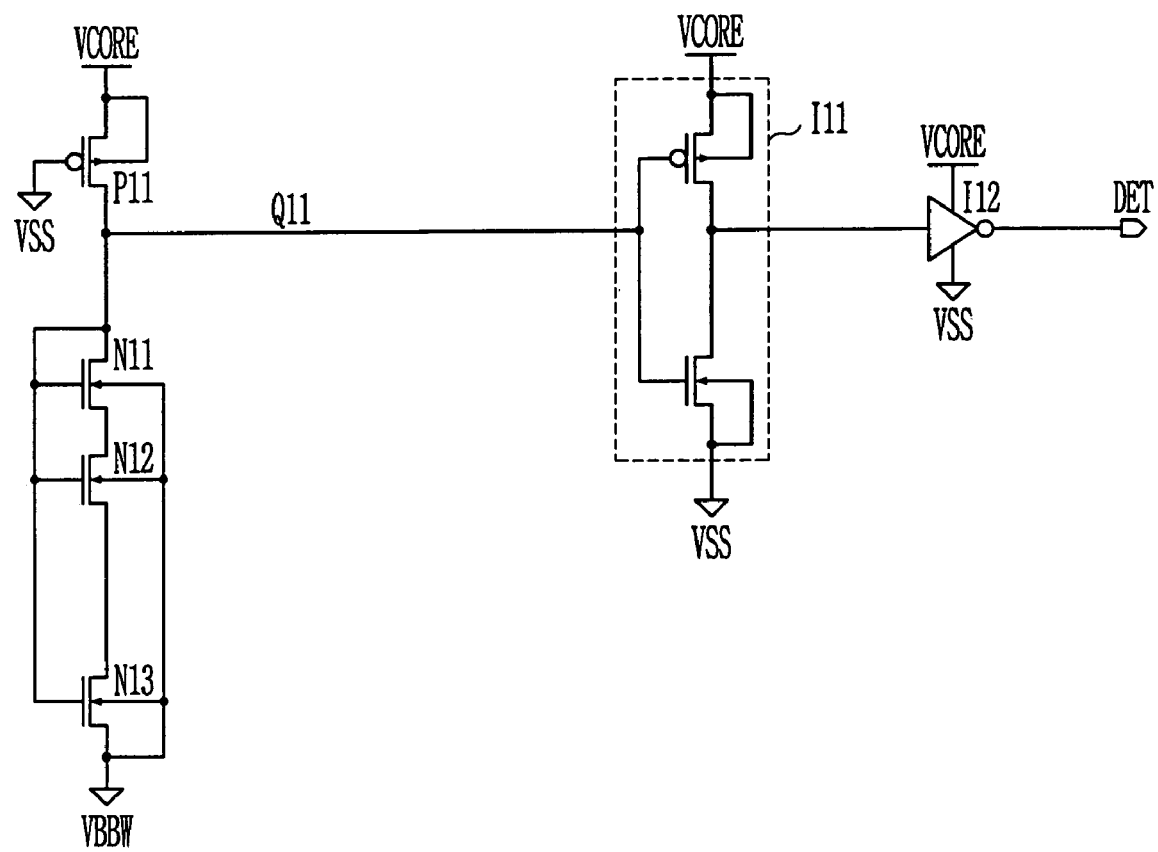
FIG. 1 is a structure diagram illustrating a conventional circuit for detecting a negative word line voltage.
Figure 2:
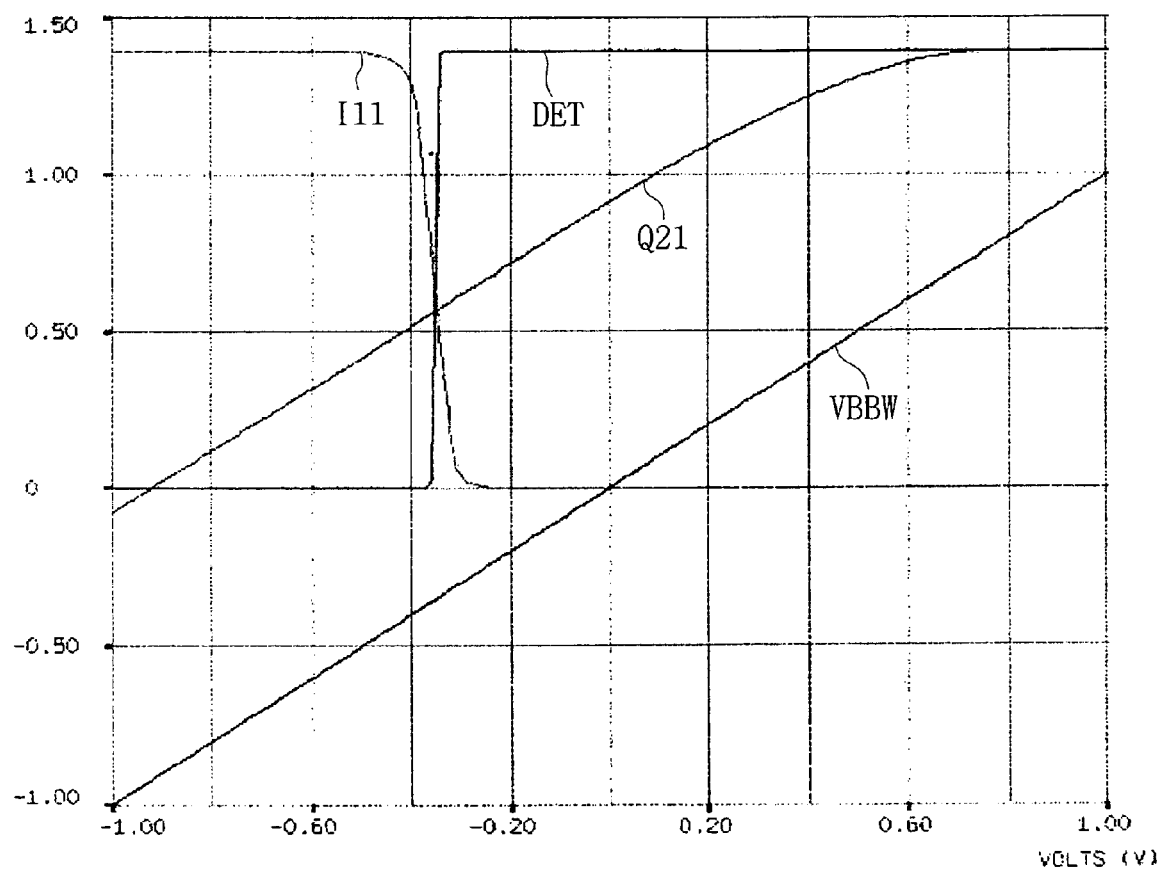
FIG. 2 is a waveform diagram illustrating simulation results of FIG. 1.
Figure 3:
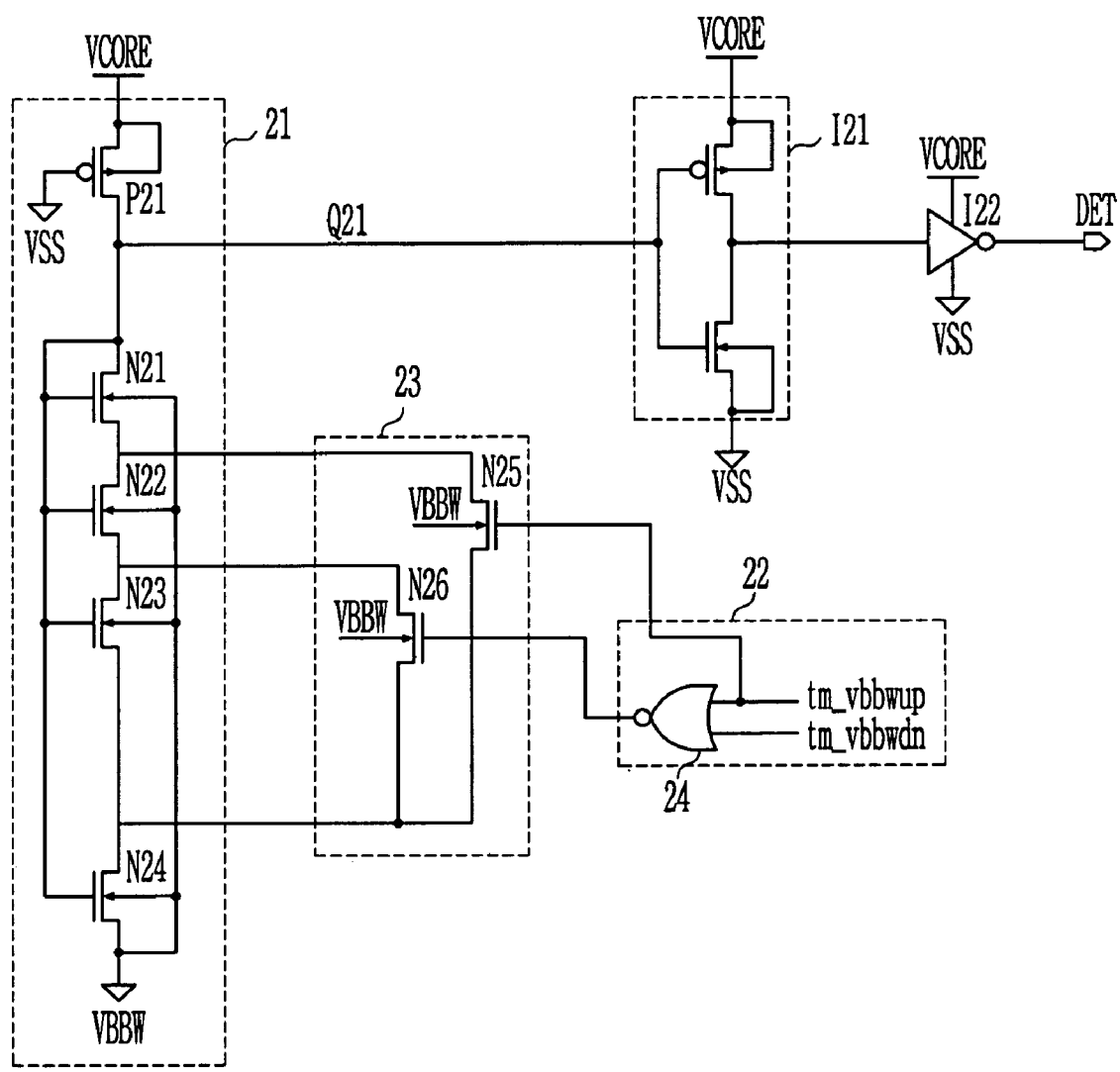
FIG. 3 is a structure diagram illustrating a circuit for detecting a negative word line voltage in accordance with a first embodiment of the present invention.

FIG. 3 is a structure diagram illustrating a circuit for detecting a negative word line voltage in accordance with a first embodiment of the present invention.

As illustrated in FIG. 3, a detecting unit 21 includes a first PMOS transistor P21 diode-coupled between a power supply terminal VCORE and a first node Q21 and driven according to a ground voltage VSS, and a plurality of NMOS transistors N21 to N24 diode-coupled between the first node Q21 and a negative word line voltage terminal VBBW, respectively. A coupling number of the plurality of NMOS transistors N21 to N24 is varied by a control unit 23, and thus the whole resistance is changed. Here, when the operator changes a negative word line voltage VBBW to obtain a wanted negative word line voltage VBBW, a potential of the first node Q21 is changed according to the negative word line voltage VBBW, having a difference of threshold voltages of the plurality of NMOS transistors N21 to N24. On the other hand, resistors can be coupled and operated as loads, instead of the diode-coupled first PMOS transistor P21 or NMOS transistors N21 to N24.

A test signal generating unit 22 outputs a first test signal tm_vbbwup for testing rise of the negative word line voltage VBBW, a second test signal tm_vbbwdn for testing fall of the negative word line voltage VBBW, and a third test signal (normal) for testing the negative word line voltage VBBW in a normal state according to combinations of the first and second test signals tm_vbbwup and tm_vbbwdn. A NOR gate 24 receives the first test signal tm_vbbwup and the second test signal tm_vbbwdn, and outputs the third test signal (normal).

The control unit 23 includes a plurality of NMOS transistors N25 and N26 coupled in parallel to the NMOS transistors N21 to N24 of the detecting unit 21. The plurality of NMOS transistors N25 and N26 are driven according to the test signals from the test signal generating unit 22, respectively, for controlling the potential of the first node Q21 according to the negative word line voltage VBBW of the detecting unit 21. For example, the fifth NMOS transistor N25 is coupled in parallel to the second NMOS transistor N22 and driven according to the first test signal tm_vbbwup, and the sixth NMOS transistor N26 is coupled in parallel to the third NMOS transistor N23 and driven according to the third test signal (normal). When the fifth NMOS transistor N25 is turned on, only the first and fourth NMOS transistors N21 and N24 are coupled between the first node Q21 and the negative word line voltage terminal VBBW. Accordingly, the potential of the first node Q21 is determined according to the power supply voltage VCORE, the negative word line voltage VBBW and the resistance value by the first and fourth NMOS transistors N21 and N24.

A first inverter I21 outputs the power supply voltage VCORE or a ground voltage Vss in response to the potential of the first node Q21, and a second inverter I22 outputs the power supply voltage VCORE or a ground voltage Vss in response to the output signal from the first inverter I21.

The driving method of the circuit for detecting the negative word line voltage in accordance with the present invention will now be explained.

In order to verify whether or not the negative word line voltage VBBW is a normal voltage, the test signal generating unit 22 applies the first test signal tm_vbbwup in a low state and the second test signal tm_vbbwdn in a low state. The NOR gate 24 outputs the third test signal (normal) in a high state. Accordingly, the fifth NMOS transistor N25 of the control unit 23 is turned off and the sixth NMOS transistor N26 thereof is turned on. The first, second and fourth NMOS transistors N21, N22 and N24 of the detecting unit 21 are coupled to the negative word line voltage terminal VBBW, and thus the potential of the first node Q21 is determined according to the power supply voltage VCORE, the negative word line voltage VBBW and the resistance by the first, second and fourth NMOS transistors N21, N22 and N24. The potential of the first node Q21 is inverted by the first inverter I1 and an output of the first inverter is inverted by the second inverter I2, thereby determining potential of an output terminal DET. If the first node Q21 have a potential enough to turn on an NMOS transistor of the first inverter I21, the output terminal DET becomes a high level. If the output terminal DET is a high level, the negative word line voltage VBBW becomes the normal voltage.

However, In case of requiring a new negative word line voltage higher than the negative word line voltage VBBW due to a temperature or other process factors in manufacturing the memory device, the new negative word line voltage is set by the following method.

The test signal generating unit 22 applies the first test signal tm_vbbwup in a high state and the second test signal tm_vbbwdn in a low state. The NOR gate 24 outputs the third test signal (normal) in a low state. Therefore, the fifth NMOS transistor N25 of the control unit 23 is turned on and the sixth NMOS transistor N26 thereof is turned off. The first and fourth NMOS transistors N21 and N24 of the detecting unit 21 are coupled to the negative word line voltage terminal VBBW, and thus the potential of the first node Q21 becomes lower than the initial state. Here, when the detection level of the detecting unit 21, namely the potential of the first node Q21 does not turn on the NMOS transistor of the first inverter I21, the negative word line voltage VBBW higher than the previous is applied to rise the voltage level of the detecting unit 21. When the detection voltage of the detecting unit 21 is sufficiently increased to turn on the NMOS transistor of the first inverter I21, the first inverter I21 outputs a low state signal, and the signal is outputted through the second inverter I22 as a high state signal, thereby obtaining of the new negative word line voltage higher than the normal voltage.

However, In case of requiring a new negative word line voltage lower than the negative word line voltage VBBW due to a temperature or other process factors in manufacturing the memory device, the new negative word line voltage is set by the following method.

The test signal generating unit 22 applies the first test signal tm_vbbwup in a low state and the second test signal tm_vbbwdn in a high state, the NOR gate 24 outputs the third test signal (normal) in a low state. Therefore, the fifth and sixth NMOS transistors N25 and N26 of the control unit 23 are turned off. The first to fourth NMOS transistors N21 to N24 of the detecting unit 21 are coupled to the negative word line voltage terminal VBBW, and thus the potential of the first node Q21 becomes higher than the normal state. Here, the detection level of the detecting unit 21, namely the potential of the first node Q21 turns on the NMOS transistor of the first inverter I21 earlier than the initial state, to output a low state signal. The signal is outputted through the second inverter I22 as a high state signal, thereby obtaining of the new negative word line voltage lower than the normal voltage.

Figure 4:
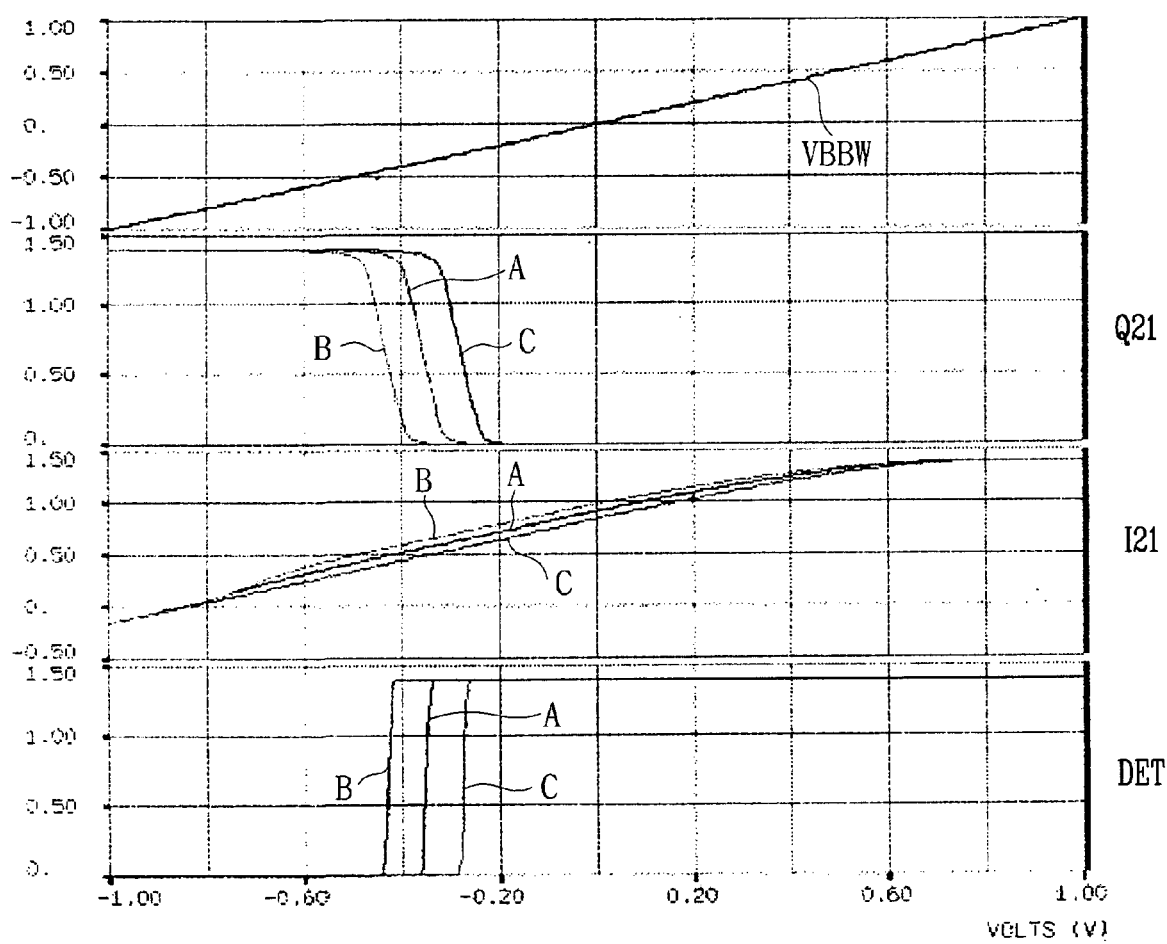
FIG. 4 is a waveform diagram illustrating simulation results of FIG. 3.

FIG. 4 is a waveform diagram illustrating simulation results of the circuit for detecting the negative word line voltage in accordance with the present invention. As shown in FIG. 4, the circuit for detecting the negative word line voltage can detect rise and fall of the voltage levels in two test modes, namely the high voltage and low voltage as well as the normal state. In FIG. 4, A denotes waveforms of each node in the normal state, B denotes waveforms of each node in the fall of the negative word line voltage, and C denotes waveforms of each node in the rise of the negative word line voltage.

Figure 5:
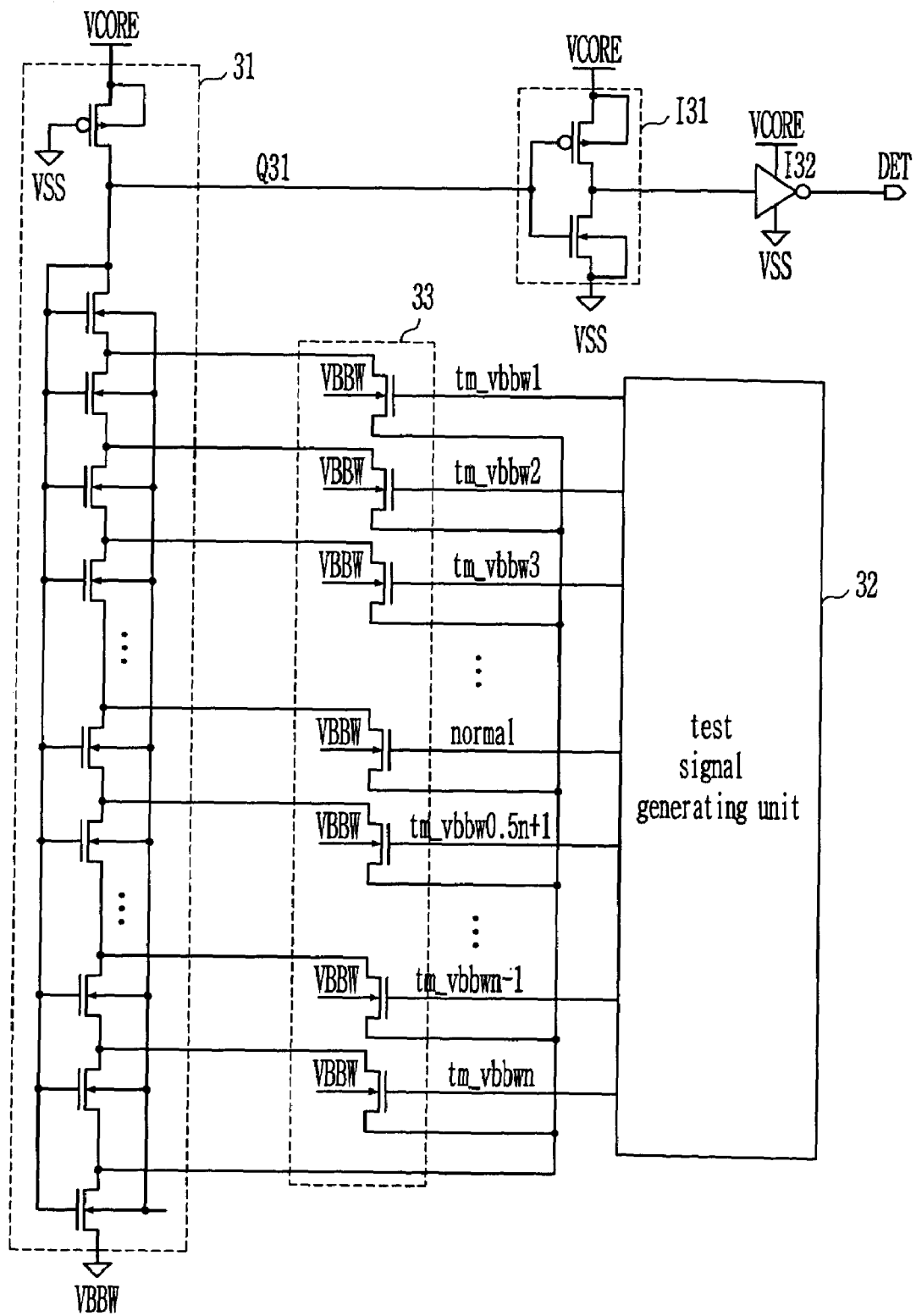
FIG. 5 is a structure diagram illustrating a circuit for detecting a negative word line voltage in accordance with a second embodiment of the present invention.

FIG. 5 is a structure diagram illustrating a circuit for detecting a negative word line voltage in accordance with a second embodiment of the present invention. A test signal generating unit 32 generates n test signals. Accordingly, n NMOS transistors are coupled to compose a control unit 33, and n NMOS transistors are coupled to compose a detecting unit 31. It is thus possible to detect negative word line voltages in n voltage levels.

As discussed earlier, in accordance with the present invention, the circuit for detecting the negative word line voltage can detect a wanted level of negative word line voltage by using the plurality of test signals without modifying the circuit, to reduce a development period of DRAM semiconductor products.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A circuit for detecting a negative word line voltage, comprising:
    a detecting unit for detecting a negative word line voltage in a detection node by using loads coupled in series between a power supply terminal and a negative word line voltage terminal;
    a test signal generating unit for generating a first test signal for detecting rise of the negative word line voltage, a second test signal for detecting fall of the negative word line voltage, and a third test signal for detecting the negative word line voltage in a normal state; and
    a control unit driven according to the test signals, for controlling a potential of the detection node by adjusting a number of the loads of the detecting unit,
    wherein the detecting unit comprising a PMOS transistor coupled between the power supply terminal and the detection node and driven according to a ground voltage, and a plurality of loads coupled in series between the detection node and the negative word line voltage terminal.

2. The circuit of claim 1, wherein each of the loads comprises a diode or a resistance.

3. The circuit of claim 1, wherein the third test signal is generated by a NOR gate that logically combines the first test signal and the second test signal.

4. The circuit of claim 1, wherein the control unit comprises a plurality of switches driven according to the respective test signals from the test signal generating unit, respectively, for controlling coupling of the loads of the detecting unit.

5. The circuit of claim 4, wherein the switches are NMOS transistors coupled in parallel to the loads of the detecting unit.

6. A circuit for detecting a negative word line voltage, comprising:
    a PMOS transistor coupled between a power supply terminal and a detection node and driven according to a ground voltage, for supplying a power supply voltage to the detecting node;
    a plurality of loads coupled in series between the detection node and a negative word line voltage terminal and driven according to the detection node;
    a test signal generating unit for generating a first test signal for detecting rise of the negative word line voltage, a second test signal for detecting fall of the negative word line voltage, and a third test signal for detecting the negative word line voltage in a normal state; and
    a control unit coupled in parallel to the plurality of loads and driven according to the test signals, for controlling a potential of the detection node by adjusting a number of the plurality of loads.

7. A circuit for detecting a negative word line voltage, comprising:
    a PMOS transistor coupled between a power supply terminal and a detection node and driven according to a ground voltage, for supplying a power supply voltage to the detecting node;
    a plurality of NMOS transistors coupled in series between the detection node and a negative word line voltage terminal and driven according to the detection node;
    a test signal generating unit for generating a first test signal for detecting rise of the negative word line voltage, and a second test signal for detecting fall of the negative word line voltage, and a third test signal for detecting the negative word line voltage in a normal state; and
    a control unit coupled in parallel to the loads and driven according to the test signals, for controlling a potential of the detection node by adjusting a number of the loads,
    wherein the third test signal is generated by a NOR gate that logically combines the first test signal and the second test signal.

8. The circuit of claim 6, wherein each of the loads comprises a diode or a resistance.

9. The circuit of claim 6, wherein the third test signal is generated by a NOR gate that logically combines the first test signal and the second test signal.

10. The circuit of claim 6, wherein the control unit comprises a plurality of switches driven according to the respective test signals from the test signal generating unit, respectively, for controlling coupling of the loads of the detecting unit.

11. The circuit of claim 10, wherein the switches include NMOS transistors coupled in parallel to the loads.

12. The circuit of claim 7, wherein the third test signal is generated by a NOR gate that logically combines the first test signal and the second test signal.

13. The circuit of claim 7, wherein the control unit comprises a plurality of switches driven according to the respective test signals from the test signal generating unit, respectively, for controlling coupling of the loads of the detecting unit.

14. The circuit of claim 13, wherein the switches include NMOS transistors coupled in parallel to the loads.

* * * * *